ns111B1" />

United States Patent
Osborne

(10) Patent No.: US 6,785,111 B1
(45) Date of Patent: Aug. 31, 2004

(54) ELECTRIC CHARGE DETECTOR

(76) Inventor: Edward G. Osborne, 110 - 55th Avenue, Lachine, Quebec (CA), H8T 3B2

( * ) Notice: Subject to any disclaimer, the term of this patent is extended or adjusted under 35 U.S.C. 154(b) by 0 days.

(21) Appl. No.: 10/662,749

(22) Filed: Sep. 15, 2003

(51) Int. Cl.$^7$ .............................................. H01H 47/32
(52) U.S. Cl. ..................... 361/152; 361/153; 361/155; 361/170; 361/189; 361/190; 340/635; 340/652; 340/653
(58) Field of Search ................................ 361/153, 152, 361/155, 160, 170, 159, 189, 190, 154; 340/635, 644, 652, 653, 654

(56) References Cited

U.S. PATENT DOCUMENTS

| | | | | |
|---|---|---|---|---|
| 4,386,315 A | * | 5/1983 | Young et al. ............... | 324/120 |
| 4,562,429 A | | 12/1985 | Conway et al. | |
| 5,021,735 A | * | 6/1991 | Maass et al. ............... | 324/175 |
| 5,359,319 A | * | 10/1994 | Campbell et al. ........... | 340/649 |
| 5,461,369 A | | 10/1995 | Campbell et al. | |
| 5,872,455 A | | 2/1999 | Pohribnij et al. | |
| 5,903,220 A | | 5/1999 | Jon et al. | |
| 6,150,945 A | | 11/2000 | Wilson | |
| 6,492,821 B1 | * | 12/2002 | Marko et al. ............... | 324/671 |
| 6,512,359 B1 | * | 1/2003 | Tamai et al. ............ | 324/117 R |

* cited by examiner

Primary Examiner—Dean A. Reichard
Assistant Examiner—Nguyen T. Ha
(74) Attorney, Agent, or Firm—Sturm & Fix LLP

(57) ABSTRACT

Electrostatic discharge can damage electronic equipment. It has been known to start a fire when it occurs when a motor vehicle's gasoline tank is being filled. A device for detecting, alarming, and/or neutralizing an electrostatic charge can help avoid these problems. A variable capacitor, the capacitance of which is made to vary periodically, is used to detect electrostatic charge. A first electrode of the capacitor is the object for which electrostatic charge is important. The capacitor's electrode is one by which the capacitance is varied. An amplitude of a signal from the electrode can be shown to be proportional to the electrostatic charge on the object.

20 Claims, 8 Drawing Sheets

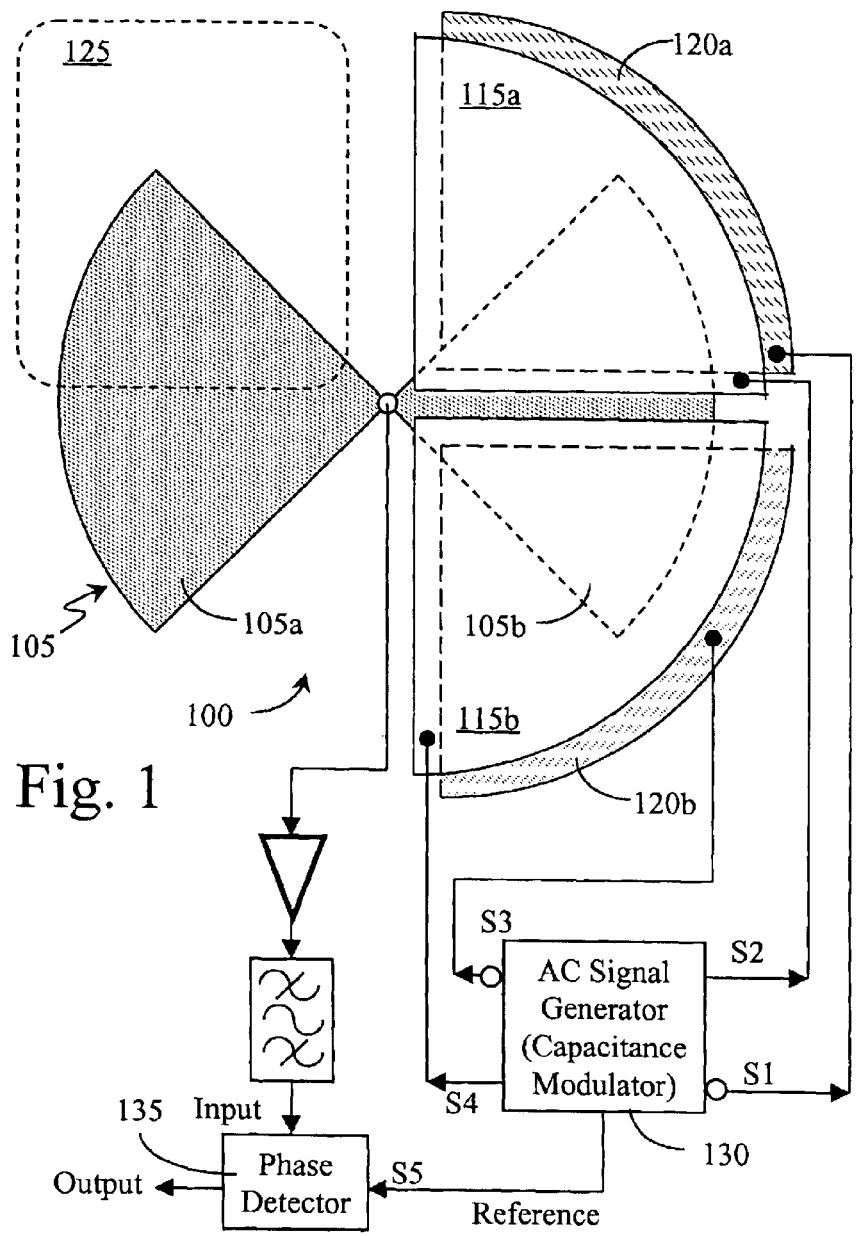

ELECTRIC CHARGE DETECTOR

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

1. Field of the Invention

The present invention relates generally to an electrical device. More particularly the present invention relates to a device for detecting an electrostatic charge on an object and alarming on the potential for electrostatic discharge. An additional action taken on sensing high potential for electrostatic discharge is the use of a positive or negative ion generator to remove the built-up charge.

2. Background Art

Electrostatic discharge between a body or object and an electronic device, such as a circuit board, can damage or destroy the electronic device. Electrostatic discharge can be very dangerous when it occurs during the process of filling a motor vehicle with gasoline, in the vicinity of the gasoline vapors. At other times, electrostatic discharge may cause discomfort. Various devices are used to dissipate an electrostatic electric charge from a body, such as a wrist strap connected to a wire going to ground. Some devices initiate an alarm in the event of an electrostatic discharge. Other devices measure and alarm on static electric charge accumulation. Wilson, in U.S. Pat. No. 6,150,945 reveals a capacitance device for measuring a charge on a body. The device is not grounded and uses a capacitor with a fixed capacitance. A charge accumulates on the fixed capacitance capacitor due to triboelectric processes. The signal, proportional to the charge on the device of U.S. Pat. No. 6,150,945, will tend to decay in magnitude over time due to the use of a high-impedance differential amplifier. This differential amplifier has a finite input resistance, and consequently, discharges the voltage on the very small capacitance produced by a triboelectric charge event.

There is, therefore, a need for a method and device for measuring the electrostatic charge accumulation on a body or object and its potential for electrostatic discharge, all without the inconvenience of a connection to ground. There is a further need for a device for measuring static charge accumulation without causing the signal representing the electrostatic charge to artificially dissipate. A further need is for a method and device for removing an accumulated electrostatic charge from a body or object.

BRIEF SUMMARY OF THE INVENTION

A purpose of this invention is to provide a method and apparatus for accurately measuring an electrostatic charge accumulated on a body or object; and, therefore, the potential for an electrostatic discharge between that body or object and another body or object having a different electrostatic charge and the capacity to change its electrostatic charge. Another purpose of the present invention is to provide a device for measuring electrostatic charge without dissipating the measured charge during the measurement. A further objective of the invention is to provide a method and apparatus for removing an electrostatic charge based on the electrostatic charge measurement results.

To measure a magnitude of electric potential with respect to ground, a capacitance of a conductor having a capacitance to ground is modulated in a periodic fashion. When the capacitance is modulated, the magnitude of the charges on this conductor also changes periodically. The amplitude of this periodic charge is proportional to the electric potential compared to ground.

To effect the above, a rotor is used, having a shape like two identical segments of a circular disk, symmetrical about a pivot point. The rotor oscillates at a fixed frequency about the pivot point with the aid of a torsion spring. One section of this rotor is one plate, or electrode, in the capacitor and oscillates behind a faraday shield in which a hole, or "window," is provided. During its travel, this rotor section will pass the window, at one point exposing the greatest surface area of the rotor to the window. It will also pass out of the window such that no part of this rotor section is exposed by the window. Any portion of this rotor section exposed by the window is exposed to the ambient. The electric charge detector experiences its lowest capacitance when this rotor section is completely hidden behind the faraday shield. When the maximum area of this rotor section is exposed to the window, the electric charge detector realizes its greatest capacitance. A second rotor section is an electrically separate conductor used as the movable part, or armature, of an electrostatic motor.

The result of the oscillation and variable capacitance is an Alternating Current (AC) signal, the magnitude of which is proportional to the electric potential applied to the electric charge detector. This signal can also be shown to be proportional to the magnitude of the electrostatic charge potential between the body or object of interest and ground. The polarity of the charge may also be determined by this invention.

When a body or object reaches a threshold charge magnitude, the electric charge detector may be configured to provide an alarm. Such an alarm would be perceptible by one or more of the senses, thus audible, visible, tactile, etc. Another, optional reaction to the detection of an electrostatic charge greater than a predetermined threshold is the generation of positive or negative ions, depending on the sign of the accumulated electrostatic charge, to neutralize the electrostatic charge on the body or object.

The novel features which are believed to be characteristic of this invention, both as to its organization and method of operation together with further objectives and advantages thereto, will be better understood from the following description considered in connection with the accompanying drawings in which a presently preferred embodiment of the invention is illustrated by way of example. It is to be expressly understood however, that the drawings are for the purpose of illustration and description only and not intended as a definition of the limits of the invention.

BRIEF DESCRIPTION OF THE SEVERAL VIEWS OF THE DRAWINGS

FIG. 1 is a plan view of an electric charge detector of the present invention along with a schematic of associated electronics;

DETAILED DESCRIPTION OF THE INVENTION

Figure 2A:
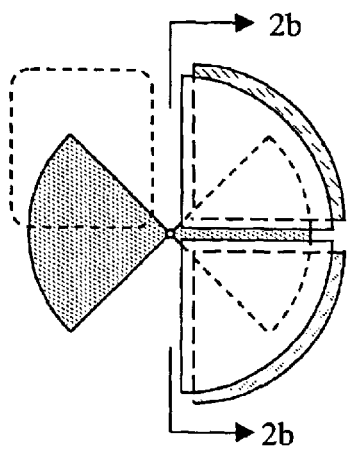
FIG. 2a is the same plan view as seen in FIG. 1, showing an orientation for FIG. 2b.

In the diagram of FIG. 1, the top edge view of a multiple-plate air capacitor is shown along with electronic function blocks and electrical connections; all comprising the electric charge detector 100. A moveable plate in the capacitor which, the first embodiment is a rotor 105, is comprised of a first rotor section 105a and a second rotor section 105b, both approximately disk sections. The rotor 105 is suspended by a torsion spring (not shown) at its center of gravity 110 so the rotor can oscillate at a fixed, resonate frequency. As the rotor oscillates, it assumes a position behind a faraday shield 200 (FIG. 2) behind which the rotor 105, and additional plates 115, 120 reside (for clarity, the faraday shield is not seen in FIG. 1). The first rotor section 105a is the conductor having variable capacitance to ground. It is connected to the charge detector circuitry. The second rotor section 105b is an electrically separate conductor which moves the rotor using electrostatic forces. When the first rotor section 105a is completely hidden by the faraday shield 200, the capacitance is at a minimum. As the rotor 105 continues to oscillate, the first rotor section 105a assumes a position exposed to the ambient via a window 125 in the faraday shield 200. When the rotor is in this position, the capacitance is a maximum. Only the portion of the surface of the first rotor section 105a exposed to the ambient via the window 125 in the faraday shield 200 participates in the capacitance of the first rotor section 105a. Varying the exposure of the first rotor section 105a to ambient is analogous to varying the surface area of the first rotor section 105a. The rotor 105 is shown halfway between these two extreme positions in FIG. 1, exposing a portion of a first rotor section 105a to the ambient.

Figure 2B:
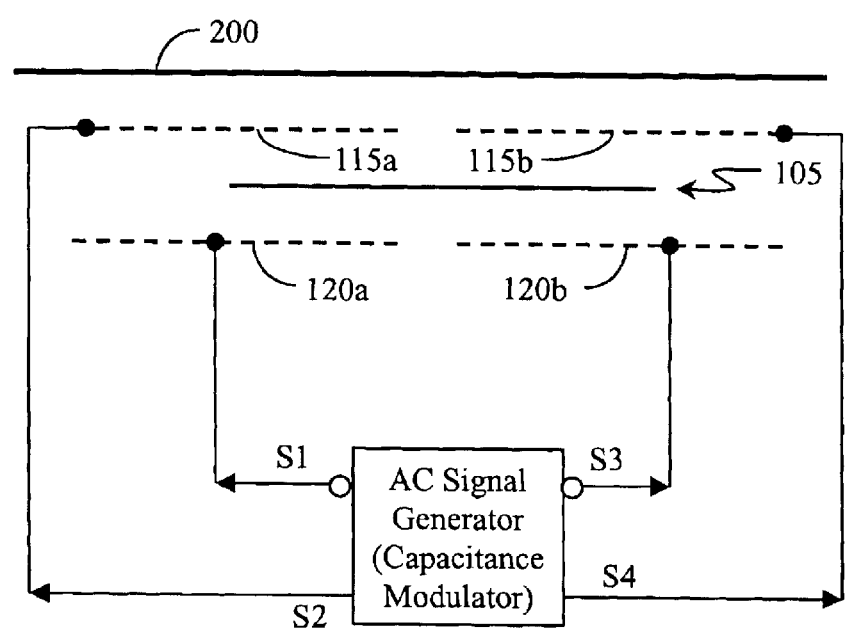
FIG. 2b is a side elevation view of the electric charge detector.
Figure 3:
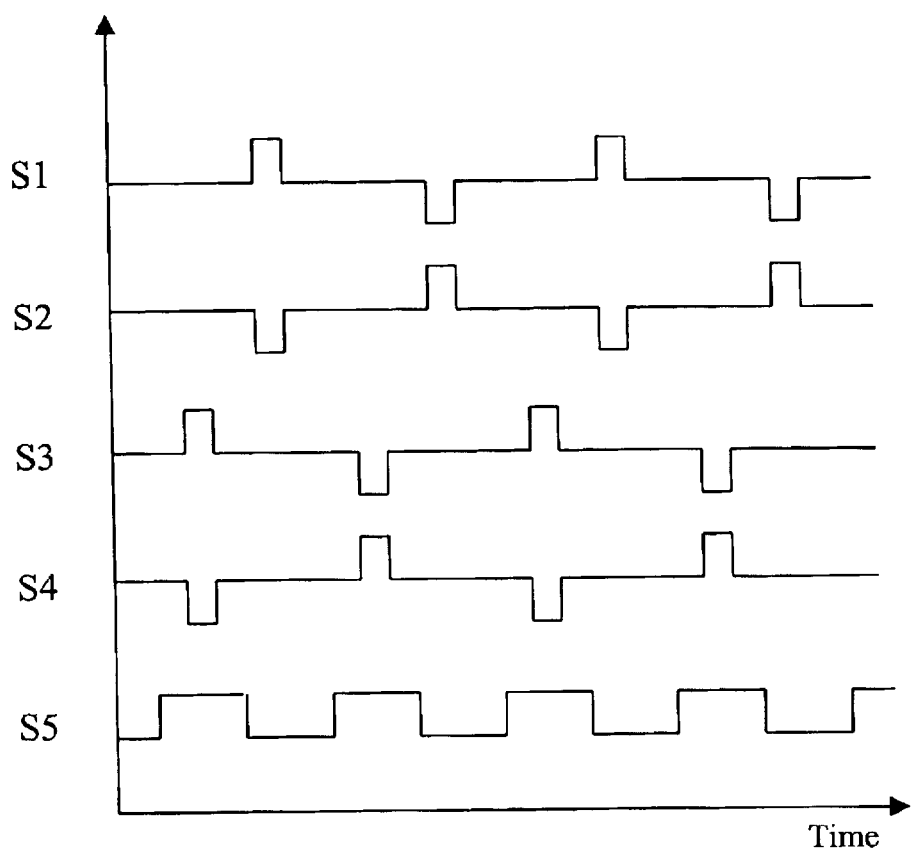
FIG. 3 is a time trace of five (5) AC signals.

Five (5) AC signals: S1, S2, S3, S4, and S5 are depicted in FIG. 3. The abscissa is time. Each signal has an ordinate that is voltage. The first four (4) signals: S1, S2, S3, and S4 are generated in an AC signal generator 130. Two signals, S1 and S2, are applied to a pair of additional plates, one lower plate 120a and one upper plate 115a respectively, while two more signals, S3 and S4, are applied to another pair of additional plates, one lower plate 120b and one upper plate 115b, respectively. The relative positions of the additional plates 115, 120, as well as the rotor 105 are depicted in FIG. 2b: additional plates 115a, 115b are above the rotor 105, while additional plates 120a,120b are below the rotor 105. The AC signals, S1, S2, S3, and S4, induce resonate mechanical oscillations in the rotor 105 by electrostatic attraction to the second rotor section 105b. The induction of a drive signal in the first section 105a of the rotor, furthest from the additional plates 115, 120, via the second rotor section 105b is minimized by charge balancing, as well as frequency doubling. The charge balance results from an upper additional plate 115a, 115b and its associated lower additional plate 120a,120b having signals of equal amplitude and opposite polarity. Thus, the induced charges on the top and bottom surfaces of the second rotor section 105b between these additional plates 115, 120 are equal. Note that signals S1, S2, S3, and S4 have twice the frequency of the input signal, S5, to the phase detector 135. The frequency doubling exploits the polarity insensitivity of electrostatic attraction between oppositely charged conductors. Electrically insulating the second rotor section 105b from the first rotor section 105a, and connecting the second rotor section 105b to a constant voltage reference 140, also contributes to signal isolation. These strategies minimize the corruption of the signal to be detected on the first rotor section 105a by the signals S1, S2, S3, and S4, that sustain the mechanical oscillations of the rotor 105. When an electric charge is applied to the device, an AC signal at the frequency shown for signal S5 in FIG. 3 will be induced in the first rotor section 105a, because this rotor section has a variable capacitance to the ambient. This AC signal, S5, is proportional to the electric charge on the apparatus and its phase with respect to signal S5 indicates the polarity of the electrostatic charge on the device.

To maximize the sensitivity of the electric charge detector 100, the surface of the first rotor section 105a can be covered with an array of sharp points to maximize the capacitance to the ambient. Sensitivity can also be improved by signal amplification 145 and filtering 150.

Other arrangements of the movable plate electrode 105 and fixed plates 115, 120 than those proposed, are possible. In a second embodiment of the invention, the variable capacitor is implemented by varying the surface texture of one electrode instead of variable area. This embodiment may be easier to implement using Micro Electro Mechanical on Silicon (MEMS) technology. In this second embodiment, an array of ribbons, which form a smooth surface, yield a minimum capacitance in one position, and in another position, an array of sharp edges, yields a maximum capacitance. With this embodiment, only small movements are required.

In a third embodiment, a capacitance divider arrangement consisting of capacitance to ambient in series with a variable capacitance to a floating ground of the device, also implies a small movement, since distance between conductors (tens of nanometers) rather than area can be modulated. A fourth embodiment is based on measuring the force of repulsion of like charges on two conductors. However, this embodiment has the disadvantage of its inability to yield polarity information of the electrostatic charge on the object or body.

Figure 4:
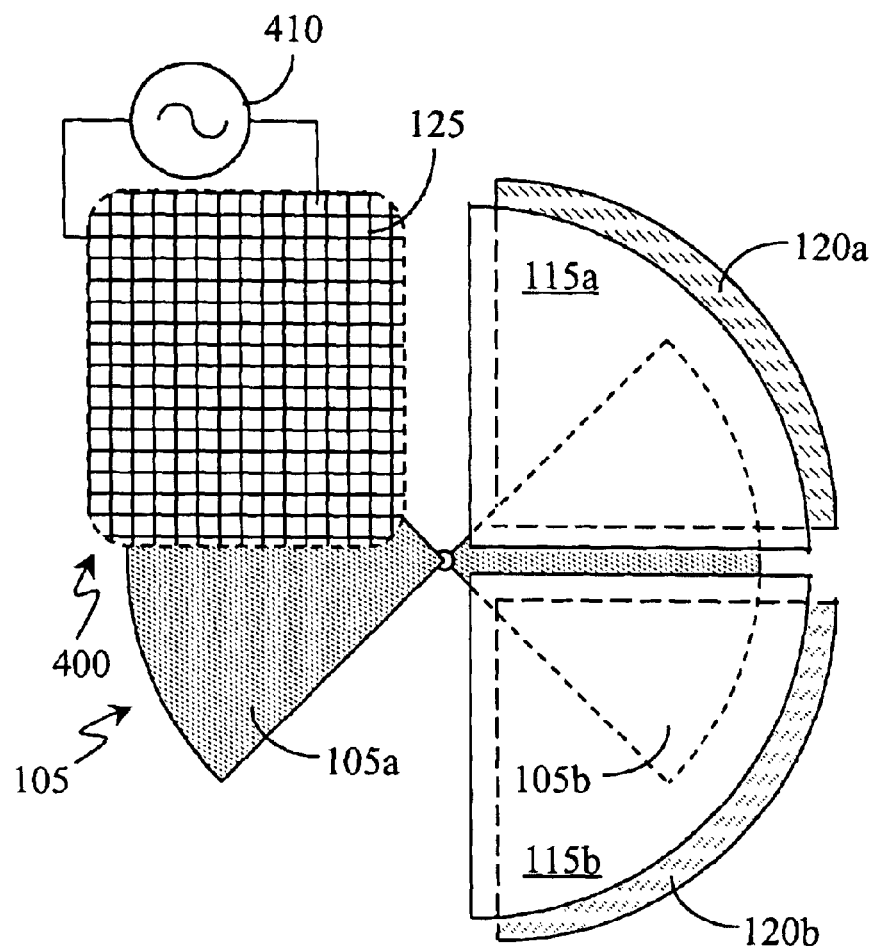
FIG. 4 is the same plan view as seen in FIG. 1, showing a wire neutralization grid inside a faraday shield window.

A fifth embodiment represents an alternative to signal amplitude measurement. In this embodiment, the electric field is neutralized to the ambient from the first rotor section 105a using a wire grid 400 at the window in the faraday shield 200 as shown in FIG. 4. A voltage applied to this wire grid 400 with a voltage source 410 can be adjusted to cancel the electric field to ambient resulting from an electrostatic charge applied to the electric charge detector. The neutralization voltage applied to the wire grid 400 is proportional to the electrostatic charge applied to the electric charge detector 100. The output signal from the phase detector 135 can be used as an error signal to control the voltage used to null this error signal. This embodiment is more expensive in MEMS technology as a result of the higher mechanical complexity. It has the advantage of greater precision, because the signal amplitude measurement is temperature sensitive due to parasitic capacitance, which is a significant fraction of the small capacitance (tens of nanofarads) to the ambient. This parasitic capacitance is temperature sensitive.

Figure 5:
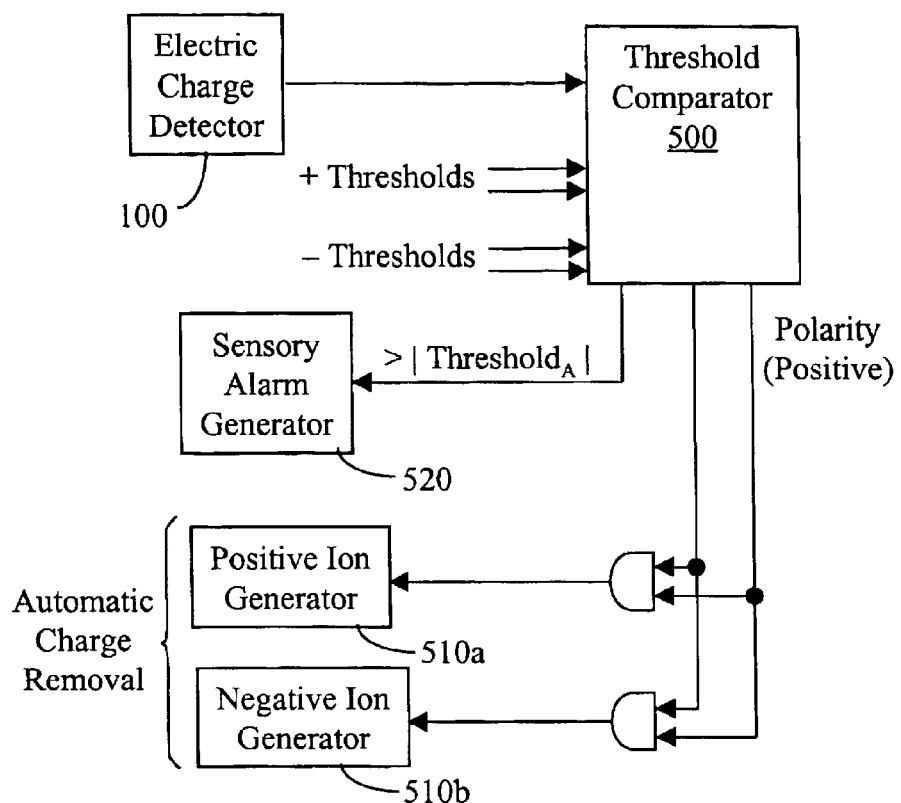
FIG. 5 is a functional diagram of the electric charge detector with an optional ion generator.
Figure 7:
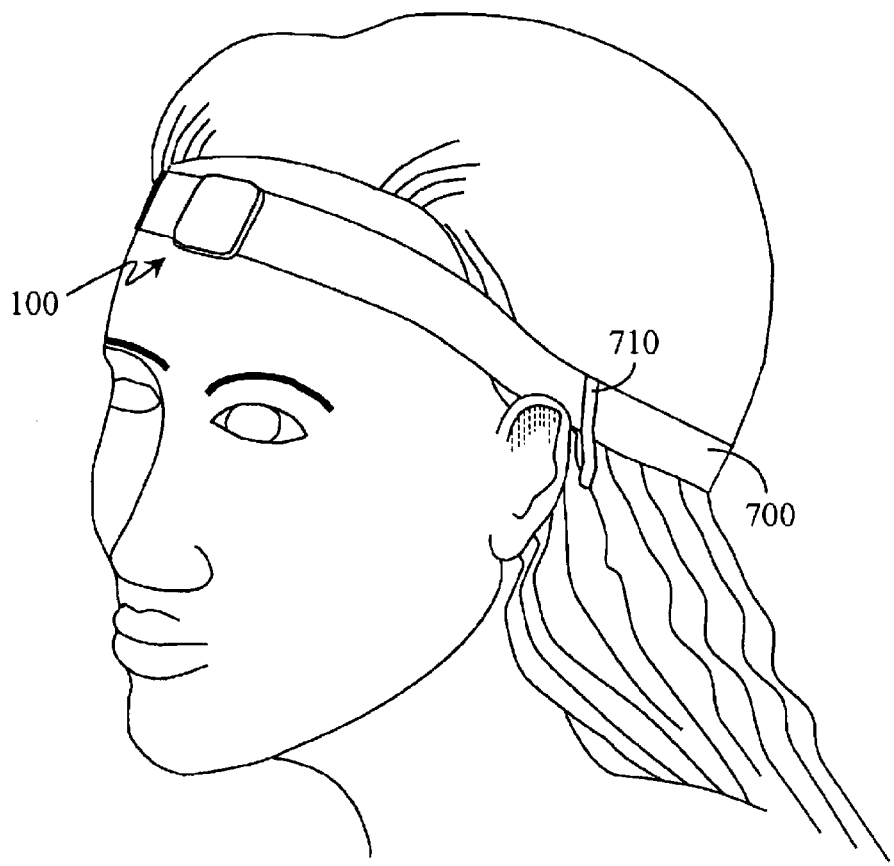
FIG. 7 is a perspective view of the electric charge detector of the present invention mounted on a headband.

A typical application is illustrated in FIG. 5. The electric charge detector 100 could be mounted on a headband 700, as shown in FIG. 7, to be worn by a person concerned about static charge buildup. Two ion generation wicks 710 are mounted on opposite sides of the headband (only one shown) to prevent ions from one wick from being collected on the other.

Figure 6:
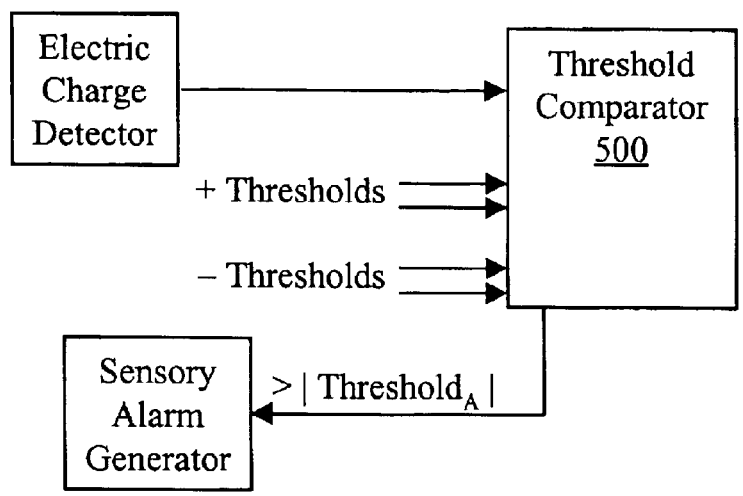
FIG. 6 is a functional diagram of the electric charge detector without an ion generator.
Figure 8:
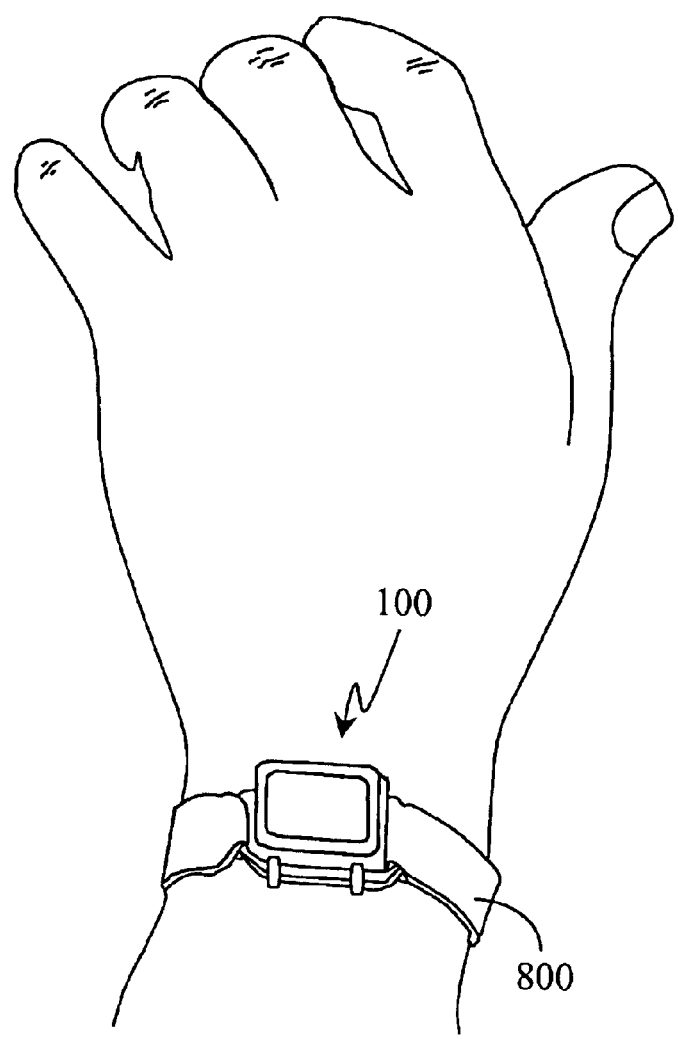
FIG. 8 is a perspective view of the electric charge detector of the present invention mounted on a wrist band.

Another implementation of the present invention is shown in FIG. 6, wherein an ion generator is not used. The wristband 800 of FIG. 8 would be a suitable fastener for this application.

In either FIG. 5 or FIG. 6, the threshold generator 500 converts the analog output of the electric charge detector 100 to three (3) digital control signals: ">|THRESHOLD$_A$|", ">|THRESHOLD$_I$|", and "POLARITY". The first, >|THRESHOLD$_A$|, is asserted when the electrostatic potential is dangerous to sensitive devices. The second, >|THRESHOLD$_I$|, is asserted when the electrostatic potential exceeds the measurement resolution threshold. This second threshold is chosen to prevent excessive cycling on and off of the ion generators 510a, 510b, resulting in excessive power consumption. The third digital control signal, POLARITY, is asserted when a positive polarity of electric potential is present on the electric charge detector 100. These three signals can be used to activate a sensory alarm 520 and/or to activate the appropriate polarity ion generator 510a, 510b.

The above embodiment is the preferred embodiment, but this invention is not limited thereto. It is, therefore, apparent that many modifications and variations of the present invention are possible in light of the above teachings. It is, therefore, to be understood that within the scope of the appended claims, the invention may be practiced otherwise than as specifically described.

I claim:

1. A method for detecting an accumulation of an electrostatic charge on an object with an electric charge detector comprising a capacitor, the method comprising the steps of:
    (a) causing a periodic variation of capacitance in a capacitor's electrode;
    (b) sensing a periodic signal from said electrode;
    (c) determining an amplitude of said periodic signal, said amplitude being proportional to the electrostatic charge accumulated on said object;
    (d) determining a phase of said periodic signal with respect to a phase of the periodic variation of capacitance; and
    (e) detecting the polarity of the electrostatic charge based on the phase of the periodic signal with respect to the phase of the periodic variation of capacitance.

2. The method of claim 1 additionally comprising the step of initiating a sensory alarm when a magnitude of the detected accumulation of electrostatic charge reaches a threshold.

3. The method of claim 2 wherein the sensory alarm is selected from a group consisting of an audible alarm, a visible alarm, and a tactile alarm.

4. The method of claim 1 wherein the step of causing the periodic variation of capacitance in the capacitor's electrode comprises the steps of:
    (a) shielding said electrode behind a faraday shield in which a window is cut; and
    (b) exposing a portion of the electrode, periodically, in the window in the faraday shield.

5. The method of claim 4 additionally comprising the step of rotating the electrode on an axis of rotation.

6. The method of claim 5 including a signal generator and an electrostatic motor, the method comprising the additional steps of:
    (a) constructing a rotor in a shape of two disk sections, symmetric about a disk's center;
    (b) electrically isolating the two disk sections, a first section being the electrode and a second section being an armature of the electrostatic motor;
    (c) mounting said rotor to pivot at the disk's center on an axis of rotation, thus causing the electrode of said rotor to sweep out a circle;
    (d) mounting the armature of the electrostatic motor in between two sets of two additional plates, each pair of said additional plates located in a quadrant of said swept circle and not blocking the window in the faraday shield; and
    (e) applying appropriate, periodic signals to the additional plates to induce resonate mechanical oscillations in the electrode.

7. The method of claim 4 wherein a wire grid is inserted into the faraday shield's window and energized with a neutralization voltage, an amplitude of the neutralization voltage being proportional to the electrostatic charge on the object.

8. The method of claim 1 including an ion generator, wherein the method additionally comprises the steps of:
    (a) detecting a polarity of electrostatic charge on the object; and
    (b) generating ions of a same charge as that of the electrostatic charge on the body.

9. The method of claim 8 therein the generation of ions is initiated when a magnitude of the electrostatic charge reaches a threshold.

10. An apparatus for detecting an accumulation of an electrostatic charge, said apparatus being mounted on an object for which the electrostatic charge is to be detected, the apparatus comprising:
    (a) an electrode in which a capacitance is varied periodically;
    (b) a sensor for sensing a periodic signal from said electrode;
    (c) means for determining an amplitude of said periodic signal, said amplitude being proportional to the electrostatic charge accumulated on said object;
    (d) means for determining a phase of said periodic signal with respect to a phase of the periodic variation of capacitance; and
    (e) means for detecting the polarity of the electrostatic charge based on the phase of the periodic signal with respect to the phase of the periodic variation of capacitance.

11. The apparatus of claim 10 additionally comprising a sensory alarm, initiated when a magnitude detected accumulation of electrostatic charge reaches a threshold.

12. The apparatus of claim 11 wherein the sensory alarm is selected from a group consisting of an audible alarm, a visible alarm, and a tactile alarm.

13. The apparatus of claim 10 additionally comprising:
    (a) a faraday shield for said electrode in which a window is cut; and
    (b) means for exposing a portion of the electrode, periodically, in the window in the faraday shield.

14. The apparatus of claim 13 additionally comprising a pivot for rotating the electrode on an axis of rotation.

15. The apparatus of claim 14 additionally comprising:

(a) a signal generator;

(b) the rotor shaped as two disk sections, symmetric about a disk's center, the two sections comprising the electrode and an armature for an electrostatic motor;

(c) a pivot at the disk's center on an axis of rotation, thus allowing the electrode to sweep out a circle when the armature is subjected to electrostatic forces;

(d) two sets of two additional plates, the electrode being mounted between each the two plates in each set, each pair of said additional plates located in a quadrant of said swept circle and not blocking the window in the faraday shield; and (e) means for applying appropriate, periodic signals to the additional plates to induce resonate mechanical oscillations in the electrode.

16. The apparatus of claim 13 additionally comprising:

(a) a wire grid inserted into the faraday shield's window; and (b) an energizing source with which to apply a neutralization voltage, an amplitude of the neutralization voltage being proportional to the electrostatic charge on the object.

17. The apparatus of claim 10 additionally comprising:

(a) a polarity detector for detecting a polarity of electrostatic charge on the object; and (b) an ion generator for generating ions of a charge opposite that of the electrostatic charge on the body.

18. The apparatus of claim 17 additionally comprising a threshold comparator for determining if a magnitude of the electrostatic charge has reached a threshold at which time the generation of ions is initiated.

19. The apparatus of claim 10 including a headband to which the apparatus is mounted.

20. The apparatus of claim 10 including a wrist band to which the apparatus is mounted.

* * * * *